(12) United States Patent
Zehnder et al.

(10) Patent No.: US 10,636,485 B1
(45) Date of Patent: Apr. 28, 2020

(54) TIME INTERLEAVED WRITING (TIW) OF PHASE CHANGE MATERIAL (PCM) FOR INFRARED SPATIAL LIGHT MODULATOR (ISLM)

(71) Applicant: HRL Laboratories, LLC, Malibu, CA (US)

(72) Inventors: Daniel M. Zehnder, Los Angeles, CA (US); Jeong-Sun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/925,229

(22) Filed: Mar. 19, 2018

Related U.S. Application Data

(60) Provisional application No. 62/516,505, filed on Jun. 7, 2017.

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 2213/79* (2013.01)

(58) Field of Classification Search
CPC ............ G11C 13/0004; G11C 13/004; G11C 13/0023; G11C 13/0028; G11C 13/0069; G11C 11/5678; G11C 13/0061
See application file for complete search history.

(56) References Cited

U.S. PATENT DOCUMENTS

| | | | |
|---|---|---|---|
| 2008/0304310 A1* | 12/2008 | Philipp | H01L 27/2436 365/148 |
| 2018/0040370 A1* | 2/2018 | Tortorelli | G11C 11/5678 |
| 2018/0122468 A1* | 5/2018 | Pirovano | G11C 13/0004 |

\* cited by examiner

*Primary Examiner* — Hien N Nguyen
(74) *Attorney, Agent, or Firm* — Ladas & Parry (57) ABSTRACT

A method for time interleaved writing includes providing a phase change material (PCM) array, the PCM array comprising a plurality of phase change material areas arranged in a two dimensional array having rows and columns, selecting PCM areas to configure, and configuring the selected PCM areas. Selecting PCM areas to configure includes selecting PCM areas to configure in both the row and column dimensions that are separated by at least two PCM areas that are not selected to be configured.

9 Claims, 6 Drawing Sheets

TIME INTERLEAVED WRITING (TIW) OF PHASE CHANGE MATERIAL (PCM) FOR INFRARED SPATIAL LIGHT MODULATOR (ISLM)

CROSS REFERENCE TO RELATED APPLICATIONS

This application relates to and claims the benefit of priority from U.S. Provisional Patent Application 62/516,505, filed Jun. 7, 2017, which is incorporated herein by reference as though set forth in full.

STATEMENT REGARDING FEDERAL FUNDING

This invention was made under U.S. Government contract W911NF-16-C-0007. The U.S. Government has certain rights in this invention.

TECHNICAL FIELD

This disclosure relates to arrays of Phase Change Material (PCM) and also relates to Infrared Spatial Light Modulators (ISLMs).

BACKGROUND

Some applications have a large two dimensional (2D) array of switches implemented with phase change material (PCM). In order to change the state of a large 2D PCM array in a fast manner a large number of switches may have to be nearly simultaneously switched from one state to the other state.

The operating mode of phase change materials is based on a change in electronic and optical properties that occurs with a rearrangement in the microscopic structure from a crystalline to an amorphous phase. The electrical conductivity can change by several orders of magnitude upon the phase transition, while the optical reflectivity changes depending on layer thickness and wavelength. Furthermore, phase change materials can be rapidly switched between the crystalline and amorphous phases.

To change the state of a 2D array of PCM switches, a set or reset pulse needs to be sent to each PCM switch. Setting or resetting a PCM switch may be referred to as writing the switch, and when a PCM switch is set or reset that may be referred as the PCM switch being written. When the set or reset pulse is sent to a particular PCM switch, heat is generated at the PCM switch. If two PCM switches are sent a set or reset pulse at the same time, another PCM switch that is adjacent to the two PCM switches and that has not been sent a set or reset pulse and whose state should not be changed, may be inadvertently switched by the heat generated by the adjacent PCMs being switched. This inadvertent and unwanted switching of an adjacent switch is quite undesirable, and can lead to improper operation of an infrared spatial light modulator (ISLM).

What is needed is an improved apparatus and method that avoids such inadvertent and unwanted switching. The embodiments of the present disclosure answer these and other needs.

SUMMARY

In a first embodiment disclosed herein, a method for time interleaved writing comprises providing a phase change material (PCM) array, the PCM array comprising a plurality of phase change material areas arranged in a two dimensional array having rows and columns, selecting PCM areas to configure, and configuring the selected PCM areas, wherein selecting PCM areas to configure comprises selecting PCM areas to configure in both the row and column dimensions that are separated by at least two PCM areas that are not selected to be configured.

In another embodiment disclosed herein, a method for time interleaved writing comprises providing a phase change material (PCM) array, the PCM array comprising a plurality of phase change material areas arranged in a two dimensional array having rows 0 to N, and columns 0 to M, configuring a PCM area for row 0 and column 0 in the PCM array and configuring every PCM area in a row that is a multiple of 3 from row 0 and every PCM area in a column that is a multiple of 3 from column 0, configuring a PCM area for row 0 and column 1 in the PCM array and configuring every PCM area in a row that is a multiple of 3 from row 0 and in a column that is a multiple of 3 from column 1, configuring a PCM area for row 0 and column 2 in the PCM array and configuring every PCM area in a row that is a multiple of 3 from row 0 and in a column that is a multiple of 3 from column 2, configuring a PCM area for row 1 and column 0 in the PCM array and configuring every PCM area in a row that is a multiple of 3 from row 1 and in a column that is a multiple of 3 from column 0, configuring a PCM area for row 1 and column 1 in the PCM array and configuring every PCM area in a row that is a multiple of 3 from row 1 and in a column that is a multiple of 3 from column 1, configuring a PCM area for row 1 and column 2 in the PCM array and configuring every PCM area in a row that is a multiple of 3 from row 1 and in a column that is a multiple of 3 from column 2, configuring a PCM area for row 2 and column 0 in the PCM array and configuring every PCM area in a row that is a multiple of 3 from row 2 and in a column that is a multiple of 3 from column 0, configuring a PCM area for row 2 and column 1 in the PCM array and configuring every PCM area in a row that is a multiple of 3 from row 2 and in a column that is a multiple of 3 from column 1, and configuring a PCM area for row 2 and column 2 in the PCM array and configuring every PCM area in a row that is a multiple of 3 from row 2 and in a column that is a multiple of 3 from column 2. In yet another embodiment disclosed herein, an apparatus for time interleaved writing comprises a phase change material (PCM) array, the PCM array comprising a plurality of phase change material areas arranged in a two dimensional array having rows and columns, a row select input, a first row demultiplexer coupled to the row select input, and having a plurality of outputs, each respective output comprising a respective pulse line coupled to each PCM area in a respective row, a plurality of switches, each respective switch connected to a respective PCM area and to a respective pulse line, and a plurality of switch control lines, each respective switch control line connected to a respective switch, wherein the row select input is decoded by the first row demultiplexer to select a pulse line or pulse lines connected to a row or rows, respectively, wherein when a respective switch control line is in an on state for a respective switch, then a set pulse or a reset pulse on a selected respective pulse line coupled to the respective switch sets or resets, respectively, a respective PCM area coupled to the respective switch, and wherein the respective PCM areas set or reset are separated by at least two PCM areas that are not selected to be set or reset.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes an apparatus and a method for time interleaved writing (TIW) of a two dimensional array of phase change material (PCM). The two dimensional array of phase change material (PCM) may be used as an infrared spatial light modulator (ISLM); however, the time interleaved writing method also may be used for other applications with a two dimensional array of phase change material (PCM).

Figure 2:
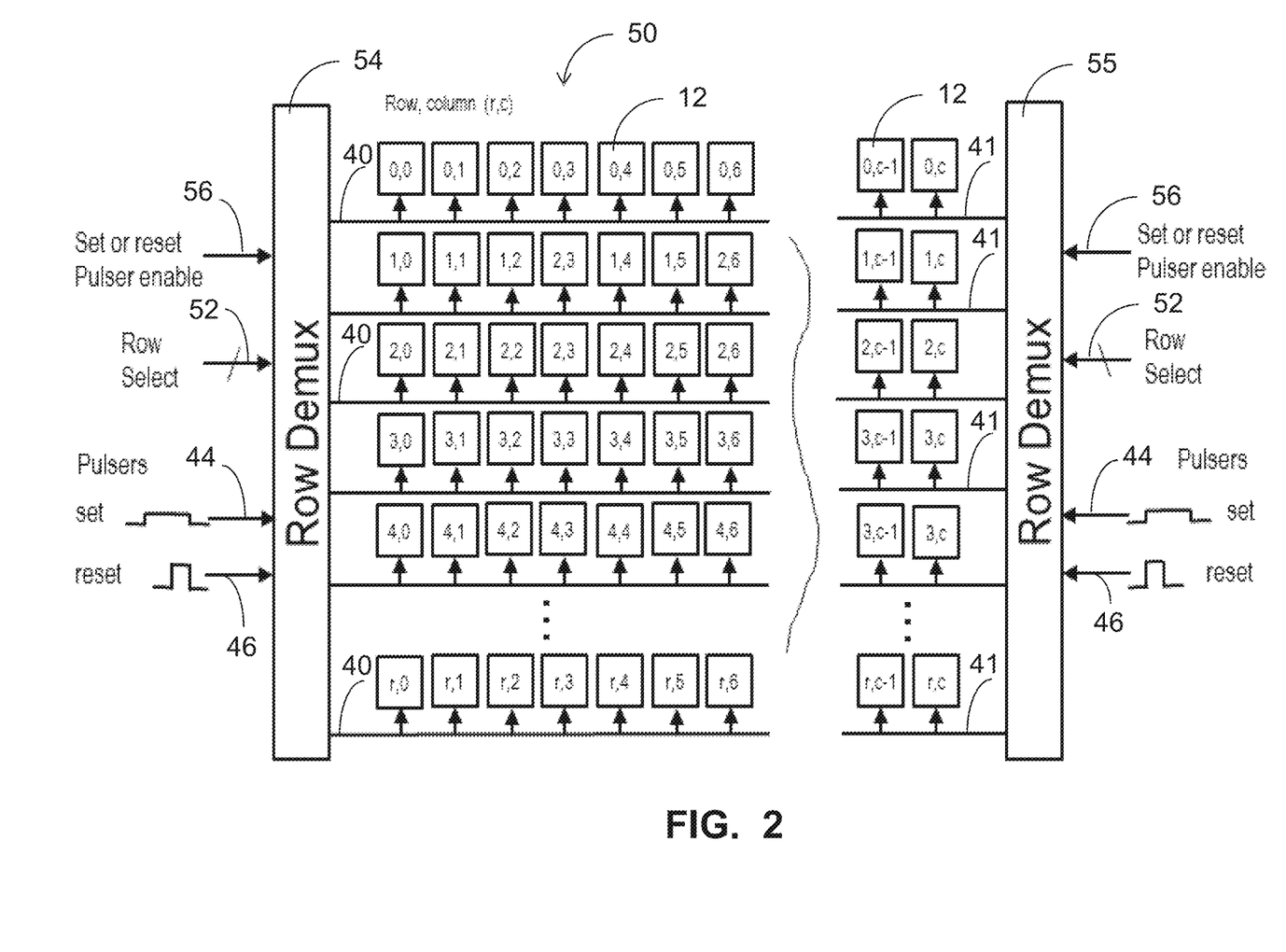
FIG. 2 shows a PCM switch array arranged in rows and columns and control logic in accordance with the present disclosure.

For implementing the ISLM, each PCM area 12 in the 2D array has a square shape and the PCM areas are arranged in a two dimensional (2D) array of rows and columns, as best shown in FIG. 2. Each PCM area 12 is separated from the other PCM areas, so that there are spaces between the PCM areas; however, to provide as much coverage as possible for the ISLM, the PCM areas 12 are arranged as close as possible to each other in the rows and columns.

Although a square shape may be used for each PCM area for an ISLM, PCM areas for other applications may have other shapes, including rectangles, polygons, circles and ovals to name a few.

Each PCM area 12 has two states, a set and a reset state, and each individual PCM in the 2D array may be put in either a set or a reset state. The pattern of PCM areas in the 2D array in a set or a reset state may be random. In order to change the state of a large 2D PCM array in a fast manner, many of the PCM areas in the 2D array may need to have their states changed at essentially the same time. To achieve the fastest change of state for a large 2D PCM array, the change of states for each PCM area that needs to change from set to reset, or from reset to set needs to occur as near simultaneously as possible, while avoiding setting or resetting PCM areas that shouldn't be changed.

Figure 1:
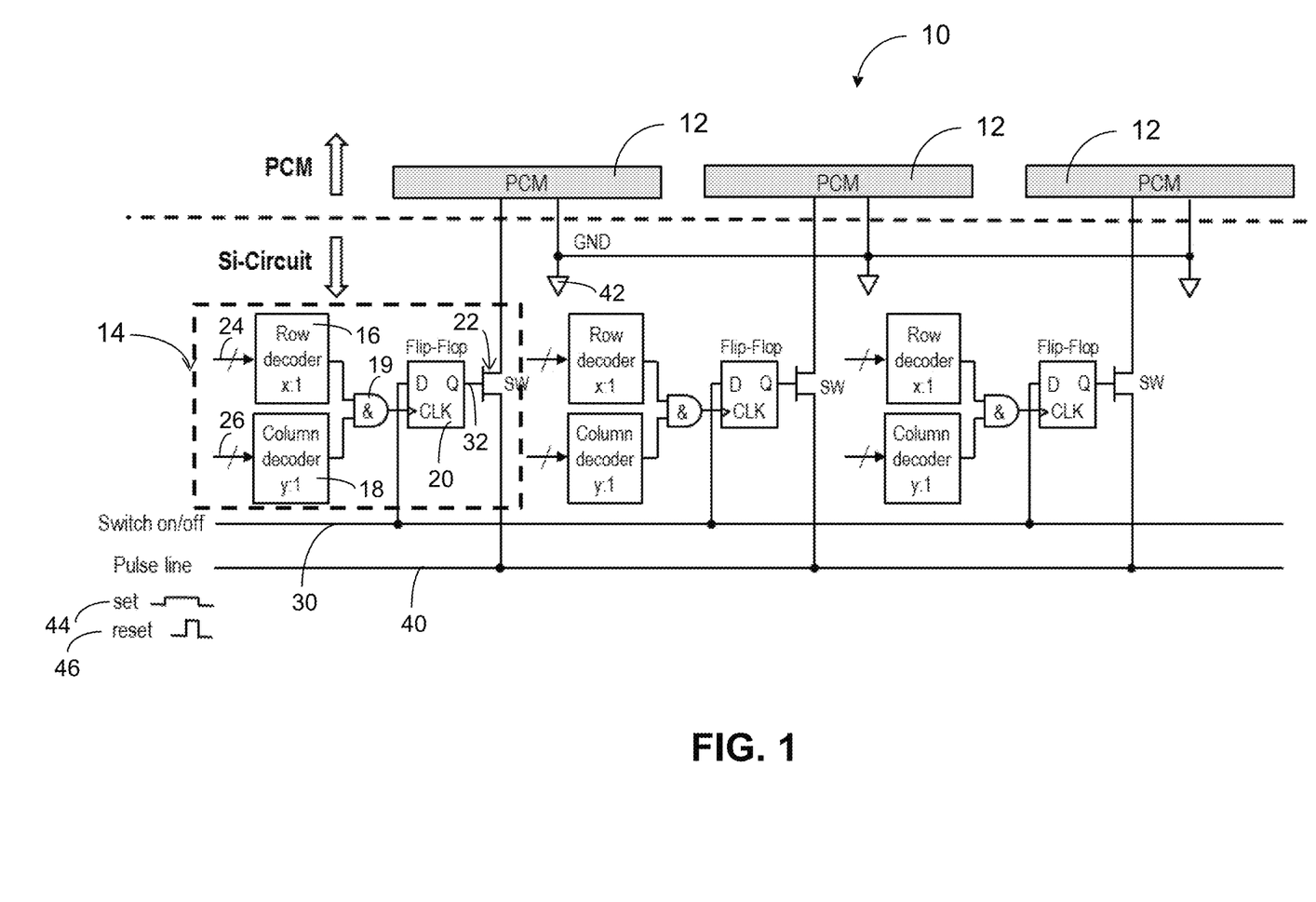
FIG. 1 shows a detailed view of one partial row of control logic for each PCM switch in accordance with the present disclosure.

In order to change the state of a PCM area 12, a set pulse 44 or reset pulse 46, as shown in FIG. 1, is sent to the PCM area 12. Applying either a set or a reset pulse generates heat. So, if two PCM areas are set or reset at the same time that are each adjacent to a PCM area that should not be changed, then the heat generated by the two PCMs areas that are set or reset can change the state of the PCM area that should not be changed. The present disclosure describes a method to avoid this unwanted change of state for a PCM area.

FIG. 1 depicts a detailed view of one partial row 10 of a two dimensional (2D) array, showing the each PCM area 12, and the control logic 14 associated with each respective PCM area 12. Each control logic 14 has a row decoder 16, a column decoder 18, an AND gate 19, a flip-flop 20, and a switch 22. The AND gate 19 has an output that is high if both the row and the column is enabled by the row and column decoders, and the output of the AND gate 19 is connected to the flip-flop clock input. For a respective switch 22 to be turned on, the row code input 24 to the row decoder 16 must designate the row of the respective switch 22, and the column code input 26 to the column decoder 18 must designate the column of the respective switch 22. In addition a switch on/off line 30, which is connected to each flip-flop 20, in the row must be on. The flip-flop output 32 based on these inputs either enables or disables a respective switch 22.

In addition each row has a low resistance pulse line 40 that is connected to each switch 22 in the row. If a respective switch 22 is "on" then the pulse line 40 is connected to a respective PCM area 12 that is connected to the switch 22. Another part of each PCM area 12 is connected to a common ground (GND) 42, which provides a return current path. The control logic 14 allows one PCM area 12 to be set or reset or multiple PCM areas 12 in the row to be set or reset at the same time. The control logic 14 may be implemented in Si circuitry.

FIG. 2 shows a 2D array 50 of PCM areas 12 from the top, arranged in columns and rows. Each row of FIG. 2 has the control logic 14 for each PCM area 12; however, the control logic 14 is not repeated in FIG. 2 for clarity. There are pulsers on the left and right side of the 2D array, which have set 44 and reset 46 pulsers. A set 44 or reset 46 pulse from the pulsers is sent to one or multiple rows of the 2D array depending on the row select 52 connected to row demultiplexers 54 and 55. The demultiplexers 54 and 55, which are on the left and the right side of the 2D array, respectively, decode the row select 52 to send the set 44 or reset 46 pulse to one or multiple rows. If a row is selected then the row decoder 16 for each control logic 14 in the row has a logic "1" output to the AND gate 19. The columns are selected by the column code 26, which is decoded by column decoder 18 for each control logic 14. If a column is selected then the column decoder 18 for each control logic 14 in the column has a logic "1" output to the AND gate 19.

Since the set pulse 44 and the reset pulse 46 need to be sent on the same pulse line, then first the set pulse 44 is sent on the pulse line to the PCM areas 12 that need to be set, and then the reset pulse 46 is sent to the PCM areas 12 that need to be reset. The control signal set or reset pulser enable 56 is used to select either the set or reset pulser.

Further, because the pulse lines are used to set or reset many PCM areas 12, pulse lines 40 may be driven from row demultiplexer 54 on the left side of the 2D array, and pulse lines 41, as shown in FIG. 2, may be driven from row demultiplexer 55 the right side of the two dimensional PCM array at the same time. The pulse lines 40 may connect to approximately half of the PCM areas 12 in a row from left to right and the pulse lines 41 may connect to approximately the other half of the PCM areas 12 in a row from right to left. Using two pulse linez 40 and 41 for a row minimizes routing distance to the PCM areas 12, lowers resistance in each pulse line, and minimizes the drive strength needed for each pulser 44 or 46 driving the pulse lines 40 and 41. The number of PCM areas 12 in a row in the array may be very large—on the order of 1000s, so driving the pulse lines 40 and 41 from both sides is preferred to minimize resistance in the pulse lines 40 and 41, and to minimize the drive strength needed for each pulser 44 or 46 driving the pulse lines 40 and 41.

FIGS. 3A, 3B, 3C and 3D depict the sequence of writing the PCM areas in such a manner that unwanted proximity heating will not cause an unwanted state change of an adjacent PCM area. Only the row demultiplexer 54 and the PCM areas 12 connected to row demultiplexer 54 are shown in FIGS. 3A, 3B, 3C and 3D; however, it should be understood that the full 2D array includes row demultiplexer 55 and the PCM areas 12 connected to row demultiplexer 55.

Figure 3A:
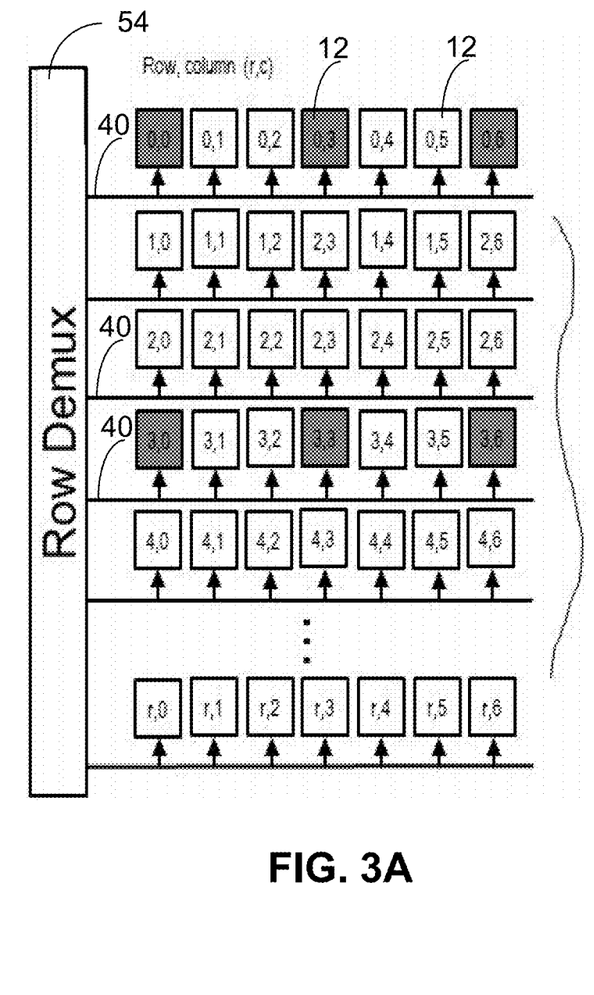
FIGS. 3A, 3B, 3C and 3D show a sequence of setting or resetting PCM switches in a 2D PCM array in accordance with the present disclosure.

In FIG. 3A and other figures, the position in the array is written as (row, column). FIG. 3A, shows two rows, 0 and 3, that are being written at the same. Rows 1 and 2 are not being written so that any particular PCM area 12 in those rows is not adjacent to two rows being written. FIG. 3A shows that the first PCM area 12 and every third PCM area 12 in rows 0 and 3 are set or reset, namely PCM areas 0,0, 0,3, 0,6 and 3,0, 3,3, 3,6. The spacing between PCM areas 12 being written assures that there are never two PCM areas 12 written at the same time that are next to a PCM area 12 that is not intended to be written. If for example PCM area 0,0 and PCM area 0,2 were written at the same time, heat would be generated at both PCM area 0,0 and PCM area 0,2, which could cause too much heat at PCM area 0,1 and could change the state of PCM area 0,1. Also skipping two rows and writing every fourth row ensures that there is no proximity heating at a PCM area 12 that is adjacent two rows.

Figure 3B:
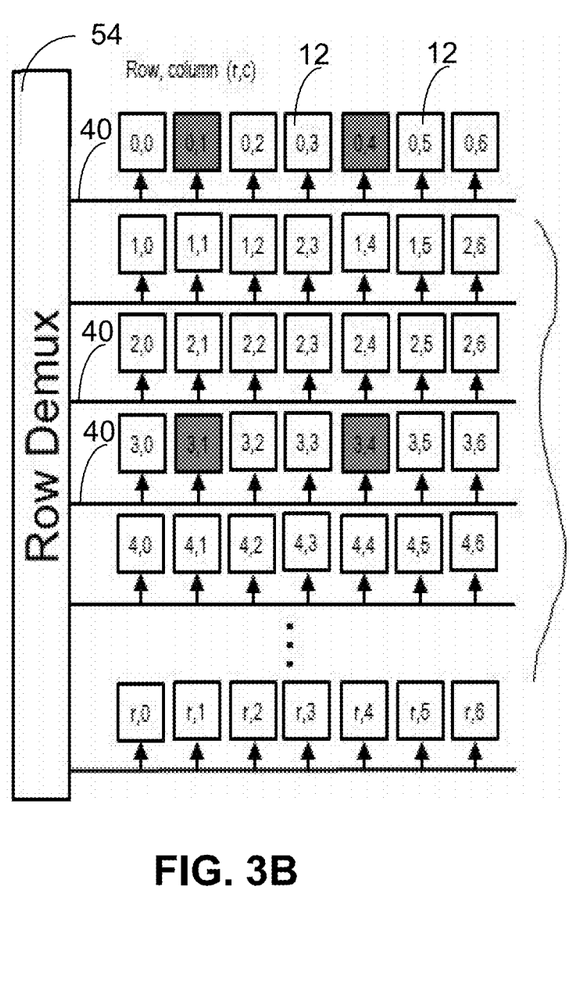

After both set 44 and reset pulse 46 are written sequentially to the two rows 0 and 3 as shown in FIG. 3A, the next PCM areas 12, to be set or reset, namely PCM areas 0,1, 0,4, 3,1 and 3,4, are selected in the two rows 0 and 3, as shown in FIG. 3B. Then these PCMs are set or reset sequentially with a set 44 pulse or a reset 46 pulse.

Figure 3C:
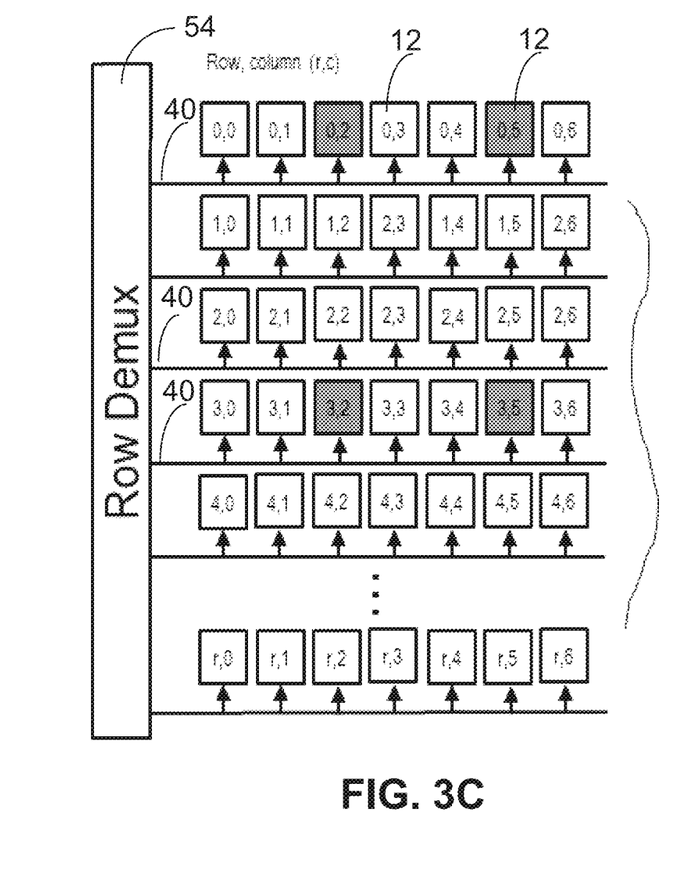

FIG. 3C shows the next set of PCM areas written in rows 0 and 3, namely PCM areas 0,2, 0,5, 3,2 and 3,5, which for the array shown in FIGS. 3A, 3B, and 3C completes the set or reset of PCM areas 12 in rows 0 and 3.

Figure 3D:
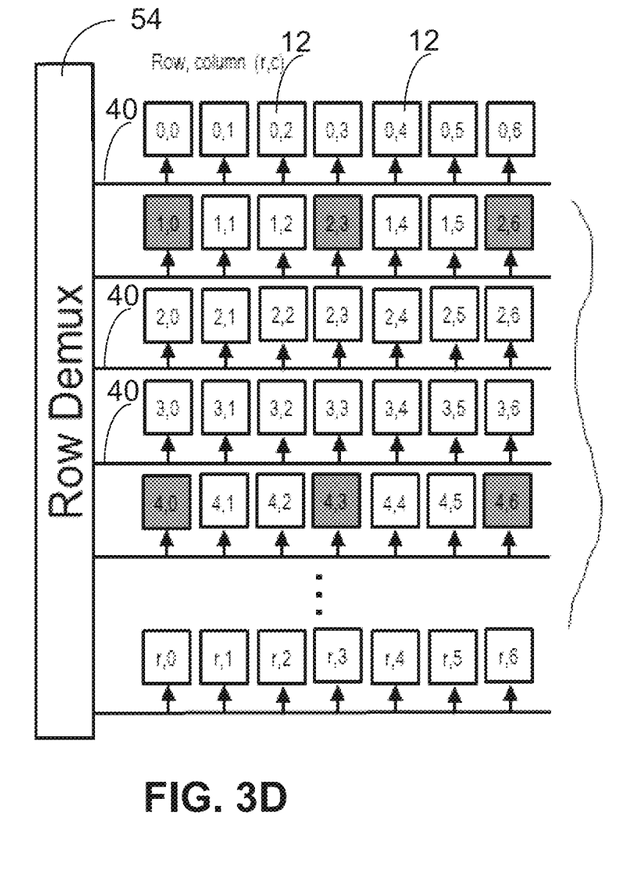

Then the next two rows, namely rows 1 and 4 are written in the same manner, as shown in FIG. 3D and this method of time interleaved writing (TIW) continues until the entire 2D PCM array is configured. The TIW avoids inadvertent and unwanted switching.

To configure PCM array most expeditiously, the above method can be extended to set or reset the PCM area 12 in rows 0, 3, 6, 9 and so on and in columns 0, 3, 6, 9 and so on, and then to set or reset the PCM area 12 in rows 0, 3, 6, 9 and so on and in columns 1, 4, 7, 10 and so on, and next to set or reset the PCM area 12 in rows 0, 3, 6, 9 and so on and in columns 2, 5, 8, 11 and so on.

Then to set or reset the PCM area 12 in rows 1, 4, 7, 10 and so on and in columns 0, 3, 6, 9 and so on, and then to set or reset the PCM area 12 in rows 1, 4, 7, 10 and so on and in columns 1, 4, 7, 10 so on, and next to set or reset the PCM area 12 in rows 1, 4, 7, 10 and so on and in columns 2, 5, 8, 11 and so on.

Next to set or reset the PCM area 12 in rows 2, 5, 8, 11 and so on and in columns 0, 3, 6, 9 and so on, and then to set or reset the PCM area 12 in rows 2, 5, 8 and so on and in columns 1, 4, 7, 10 so on, and next to set or reset the PCM area 12 in rows 2, 5, 8, 11 and so on and in columns 2, 5, 8, 11 and so on.

So, the method is to first configure the PCM area 12 for row 0 and column 0 in the array and every row that is a multiple of 3 from row 0 and every column that is a multiple of 3 from column 0. Then to configure the PCM area 12 for row 0 and column 1 in the array and every row that is a multiple of 3 from row 0 and every column that is a multiple of 3 from column 1. Next to configure the PCM area 12 for row 0 and column 2 in the array and every row that is a multiple of 3 from row 0 and every column that is a multiple of 3 from column 2.

Next to configure the PCM area 12 for row 1 and column 0 in the array and every row that is a multiple of 3 from row 1 and every column that is a multiple of 3 from column 0. Then to configure the PCM area 12 for row 1 and column 1 in the array and every row that is a multiple of 3 from row 1 and every column that is a multiple of 3 from column 1. Next to configure the PCM area 12 for row 1 and column 2 in the array and every row that is a multiple of 3 from row 1 and every column that is a multiple of 3 from column 2.

Then to configure the PCM area 12 for row 2 and column 0 in the array and every row that is a multiple of 3 from row 2 and every column that is a multiple of 3 from column 0. Then to configure the PCM area 12 for row 2 and column 1 in the array and every row that is a multiple of 3 from row 2 and every column that is a multiple of 3 from column 1. Next to configure the PCM area 12 for row 2 and column 2 in the array and every row that is a multiple of 3 from row 2 and every column that is a multiple of 3 from column 2.

The above TIW method configures the PCM array in the fastest manner while avoiding inadvertent and unwanted switching.

Figure 4A:
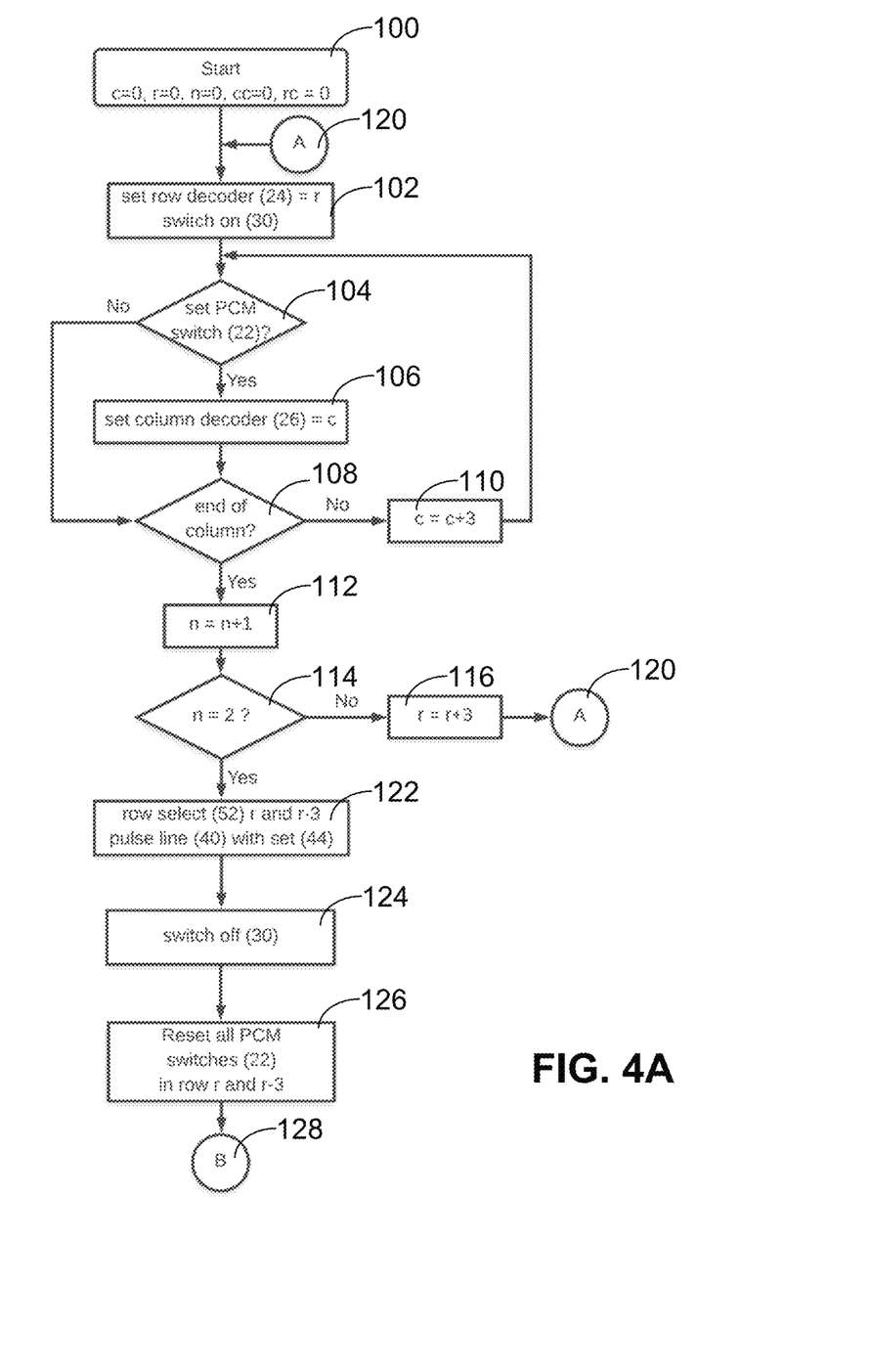
FIGS. 4A and 4B show a flow chart in accordance with the present disclosure.
Figure 4B:
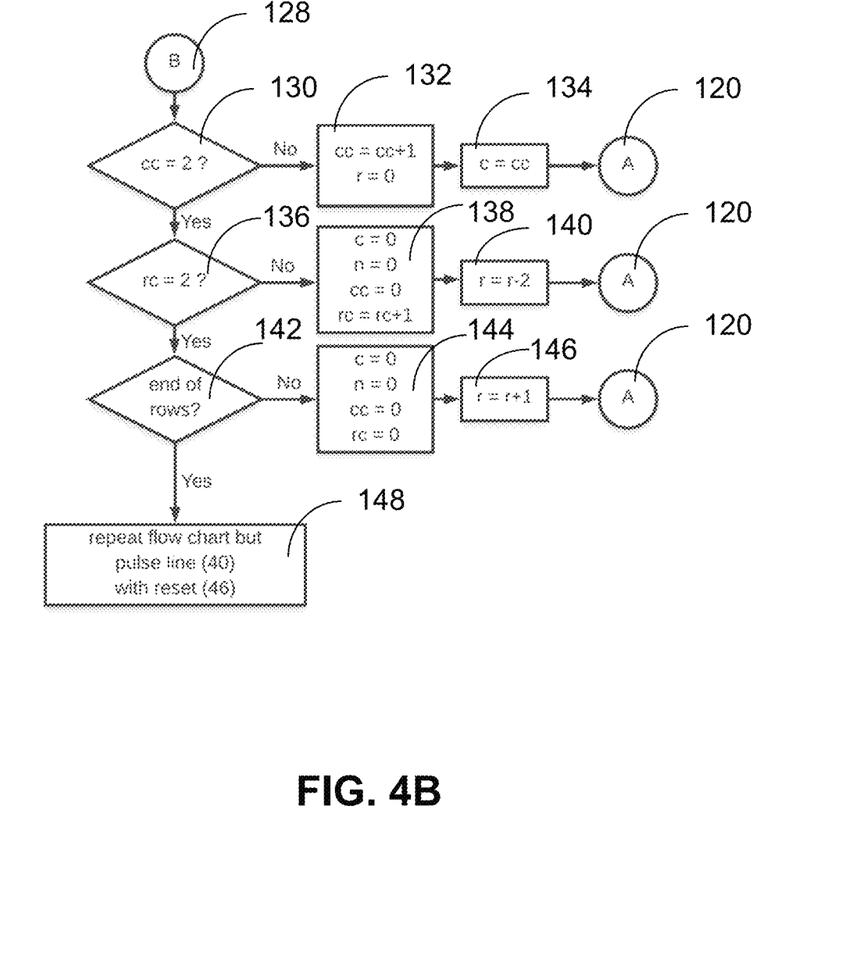

FIGS. 4A and 4B together are an example flow chart for ensuring that at least two unpulsed cells are between pulsed cells. In the flow chart the following notation is used:

c=Current column index r=Current row index.

n=Counter for number of rows pulsed at the same time. Two rows are pulsed at the same time for this example.

cc=Column counter from 0 to 2. Each column needs be pulsed three times to ensure two unpulsed cells between pulsed cells.

rc=Row counter from 0 to 2. Two rows are pulse at the same time with a separation of two unpulsed rows between two pulsed rows. This is repeated three times to pulse a total of 6 rows. Then the next set of 6 rows is pulsed.

In step 100 of FIG. 4A, c, r, n, cc and rc are set to zero. In step 102, the row decoders 24 are set to r, and the switch on/off 30 is set to on. In step 104, it is determined whether PCM switch 22 is on. If yes, then column decoder 26 is set to equal c, if no, then in step 108 it is determined whether the end of column is reached. If no, then c is set to c+3 in step 110, if yes the n is set to n+1 in step 112.

In step 114 it is determined whether n is 2, if no then r is set to r+3 in step 116 and the next step is step 102 as shown by A 120 following step 116, if yes then in step 122, row select 52 for row r and row select 52 for row r−3 is set and pulse line 40 is set with pulser set 44.

In step 124, switch on/off 30 is set to off. Then in step 126 all PCM switches 22 in row r and row r−3 are reset to be off.

B 128 connects step 126 in the flow chart in FIG. 4A to step 130 in the flow chart in FIG. 4B.

In step 130, it is determined if cc is 2, if no, then in step 132 cc is set to cc+1 and r is set to zero, in step 134 c is set to cc, and then the next step is step 102 as shown by A 120 following step 134 as shown in FIG. 4B. If cc is 2, then in step 136 it is determined if rc is 2, if no, then in step 138 c is set to zero, n is set to zero, cc is set to zero, and rc is set to rc+1, in step 140 r is set to r−2, and then the next step is step 102 as shown by A 120 following step 140 as shown in FIG. 4B. If rc is 2, then in step 142 it is determined if the end of rows has been reached, if no, then in step 144 c is set to zero, n is set to zero, cc is set to zero, and rc is set to zero, in step 146 r is set to r+1, and then the next step is step 102 as shown by A 120 following step 146 as shown in FIG. 4B.

If the end of rows in step 142 has been reached, then in step 148, the flow chart of FIGS. 4A and 4B is repeated starting at step 100, but with the pulse line 40 is reset with pulser reset 46.

The example given in FIGS. 4A and 4B is only one way to perform the TIW method to configure the PCM array in the fastest manner while avoiding inadvertent and unwanted switching and is non limiting. An ordinary person skilled in the art would understand that other flow charts could accomplish the same objective.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for time interleaved writing comprising:
   providing a phase change material (PCM) array, the PCM array comprising a plurality of phase change material areas arranged in a two dimensional array having rows and columns;
   selecting PCM areas to configure; and
   configuring the selected PCM areas;
   wherein selecting PCM areas in a respective row to configure comprises selecting PCM areas to configure that are separated by at least two PCM areas in the respective row that are not selected to be configured; and
   wherein selecting PCM areas in a respective column to configure comprises selecting PCM areas to configure that are separated by at least two PCM areas in the respective column that are not selected to be configured.

2. The method of claim 1 wherein configuring a PCM area comprises setting the PCM area, or resetting the PCM area.

3. The method of claim 2 wherein:
   setting the PCM area comprises setting the PCM area to be in a crystalline phase; and
   resetting the PCM area comprises setting the PCM area to be in an amorphous phase; or
   setting the PCM area comprises setting the PCM area to be in an amorphous phase; and
   resetting the PCM area comprises setting the PCM area to be in a crystalline phase.

4. The method of claim 1 further comprising a plurality of controllers, each respective controller coupled to a respective PCM area, and each respective controller comprising:
   providing a row decoder coupled to a row code input;
   providing a column decoder coupled to a column code input;
   providing a switch on/off line; and
   providing a switch coupled to the row decoder, the column decoder and the switch on/off line;
   providing a pulse line coupled to the switch;
   wherein when the row code and the column code indicate the respective PCM area and the switch on/off line is in an on state, then a set pulse or a reset pulse on the pulse line is coupled to the respective PCM area and sets or resets, respectively, the respective PCM area.

5. The method of claim 1 further comprising a plurality of controllers, each respective controller coupled to a respective PCM area, and each respective controller comprising:
   providing a row decoder coupled to a row code input;
   providing a column decoder coupled to a column code input;
   providing an AND gate having a first input coupled to an output of the row decoder and a second input coupled to an output of the column decoder;
   providing a flip-flop having a clock coupled to an output of the AND gate and having an input coupled to a switch on/off line; and
   providing a switch having a switch control coupled to an output of the flip-flop; and
   providing a pulse line coupled to the switch;
   wherein when the switch control is in an on state the respective PCM area is coupled to the pulse line, and wherein when the switch control is in an off state the respective PCM area is not coupled to the pulse line; and
   wherein when the row code and the column code indicate the respective PCM area and the switch on/off line is in an on state, then the switch control is in an on state and a set pulse or a reset pulse on the pulse line is coupled to the respective PCM area and sets or resets, respectively, the respective PCM area.

6. The method of claim 1 further comprising:
   providing a row select input;
   providing a first row demultiplexer, the first row demultiplexer having an input coupled to the row select input, and having a plurality of outputs, each respective output comprising a first pulse line coupled to approximately a first half of the PCM areas in a respective row;

wherein the row select input selects a row or rows to configure at any one time.

7. The method of claim 6 further comprising:

providing a second row demultiplexer, the second row demultiplexer having an input coupled to the row select input, and having a plurality of outputs, each respective output coupled to a second pulse line coupled to approximately a second half of the PCM areas in a respective row to provide an increased drive on the first and second pulse lines, to minimize routing, and to minimize resistance in the first and second pulse lines.

8. The method of claim 1 wherein configuring a respective PCM area comprises:

sending a set or reset pulse on a pulse line coupled to each PCM area in a row including the respective PCM area; and setting a respective switch connected to the pulse line in the row including the respective PCM area and connected to the respective PCM area to an on state so that the set or reset pulse on the pulse line can cause the respective PCM area to be set or reset.

9. The method of claim 8 wherein:

setting the respective PCM area comprises setting the respective PCM area to be in a crystalline phase; and resetting the respective PCM area comprises setting the respective PCM area to be in an amorphous phase; or setting the respective PCM area comprises setting the respective PCM area to be in an amorphous phase; and resetting the respective PCM area comprises setting the respective PCM area to be in a crystalline phase.

* * * * *